(12) United States Patent
Ortiz

(10) Patent No.: US 10,425,046 B1
(45) Date of Patent: Sep. 24, 2019

(54) DIFFERENTIAL POWER AMPLIFIER

(71) Applicant: Qorvo US, Inc., Greensboro, NC (US)

(72) Inventor: Jeffery Peter Ortiz, Chandler, AZ (US)

(73) Assignee: Qorvo US Inc., Greensboro, NC (US)

( * ) Notice: Subject to any disclaimer, the term of this patent is extended or adjusted under 35 U.S.C. 154(b) by 0 days.

(21) Appl. No.: 15/939,581

(22) Filed: Mar. 29, 2018

(51) Int. Cl.
| | |
|---|---|
| H03F 3/45 | (2006.01) |
| H03F 1/52 | (2006.01) |
| H03F 3/213 | (2006.01) |
| H03F 3/195 | (2006.01) |
| H03F 3/21 | (2006.01) |

(52) U.S. Cl.
CPC ............... *H03F 1/52* (2013.01); *H03F 3/195* (2013.01); *H03F 3/211* (2013.01); *H03F 3/213* (2013.01); *H03F 3/4508* (2013.01); *H03F 2200/165* (2013.01); *H03F 2200/171* (2013.01); *H03F 2200/267* (2013.01); *H03F 2200/451* (2013.01); *H03F 2200/541* (2013.01); *H03F 2200/93* (2013.01); *H03F 2203/21157* (2013.01); *H03F 2203/45186* (2013.01); *H03F 2203/45228* (2013.01); *H03F 2203/45244* (2013.01)

(58) Field of Classification Search
CPC . H03F 1/52; H03F 3/211; H03F 3/195; H03F 3/213; H03F 3/4508
USPC .................. 330/261, 298, 207 P, 251, 207 A
See application file for complete search history.

(56) References Cited

U.S. PATENT DOCUMENTS

| | | | |
|---|---|---|---|
| 6,720,831 B2 | 4/2004 | Dening et al. | |
| 7,474,154 B1 * | 1/2009 | Lee | H03F 3/45188 330/260 |

OTHER PUBLICATIONS

Pusl, J., et al., "SiGe Power Amplifier ICs with SWR Protection for Handset Applications," Microwave Journal, Available online at: <<www.microwavejournal.com/articles/3224-sige-power-amplifier-ics-with-swr-protection-for-handset-applications>>, Jun. 1, 2001, 10 pages.

* cited by examiner

*Primary Examiner* — Khanh V Nguyen
*Assistant Examiner* — Khiem D Nguyen
(74) *Attorney, Agent, or Firm* — Withrow & Terranova, P.L.L.C.

(57) ABSTRACT

A differential power amplifier having first and second amplifiers with first and second signal output terminals along with bias circuitry in communication with the first and second amplifiers is disclosed. The differential amplifier further includes a first output clamp coupled to the first signal output terminal and a bias control terminal of the bias circuitry, wherein the first output clamp is configured to limit voltage at the first signal output terminal to a first predetermined voltage magnitude and lower bias current to the first amplifier in response to an overvoltage at the first signal output terminal. A second output clamp is coupled to the second signal output terminal and is configured to limit voltage at the second signal output terminal to a second predetermined voltage magnitude.

21 Claims, 4 Drawing Sheets

DIFFERENTIAL POWER AMPLIFIER

FIELD OF THE DISCLOSURE

The present disclosure is directed to amplifiers employed by electronic communication equipment such as cellular handsets.

BACKGROUND

During a mobile phone calibration, power amplifier input power is swept to a power level as high as 10 dBm and to a maximum supply voltage of from 4-5 V. This combination of high drive level and power supply voltage can result in a peak output power 3-4 dB above normal operating conditions and collector voltages above the safe operating range of the device technology used. This puts the power amplifier at risk of being damaged and puts surface acoustic wave or bulk acoustic wave duplex filters at risk of being damaged. Exacerbating the problem is the fact that filters are being aggressively reduced in size, which limits their maximum safe power dissipation. Additionally, envelope trackers are now commonly implemented into mobile phones. Most, if not all, envelope trackers have a boost mode that can raise the maximum power amplifier supply voltage to as high as 5.5 V. Up until now, this problem has not been properly addressed as it pertains to differential power amplifiers. Thus, there is a need for new differential power amplifier that includes protective circuitry.

SUMMARY

A differential power amplifier having a first amplifier with a first signal output terminal and a second amplifier with a second signal output terminal along with bias circuitry in communication with the first and second amplifiers is disclosed. The differential power amplifier further includes a first output clamp coupled to the first signal output terminal and a bias control terminal of the bias circuitry, wherein the first output clamp is configured to limit voltage at the first signal output terminal to a first predetermined voltage magnitude and lower bias current to the first amplifier in response to an overvoltage at the first signal output terminal. A second output clamp is coupled to the second signal output terminal and is configured to limit voltage at the second signal output terminal to a second predetermined voltage magnitude.

In at least one embodiment, the second output clamp is coupled to the bias control terminal and is further configured to lower bias current to the second amplifier in response to an overvoltage at the second signal output terminal.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure and, together with the description, serve to explain the principles of the disclosure.

DETAILED DESCRIPTION

Figure 1:
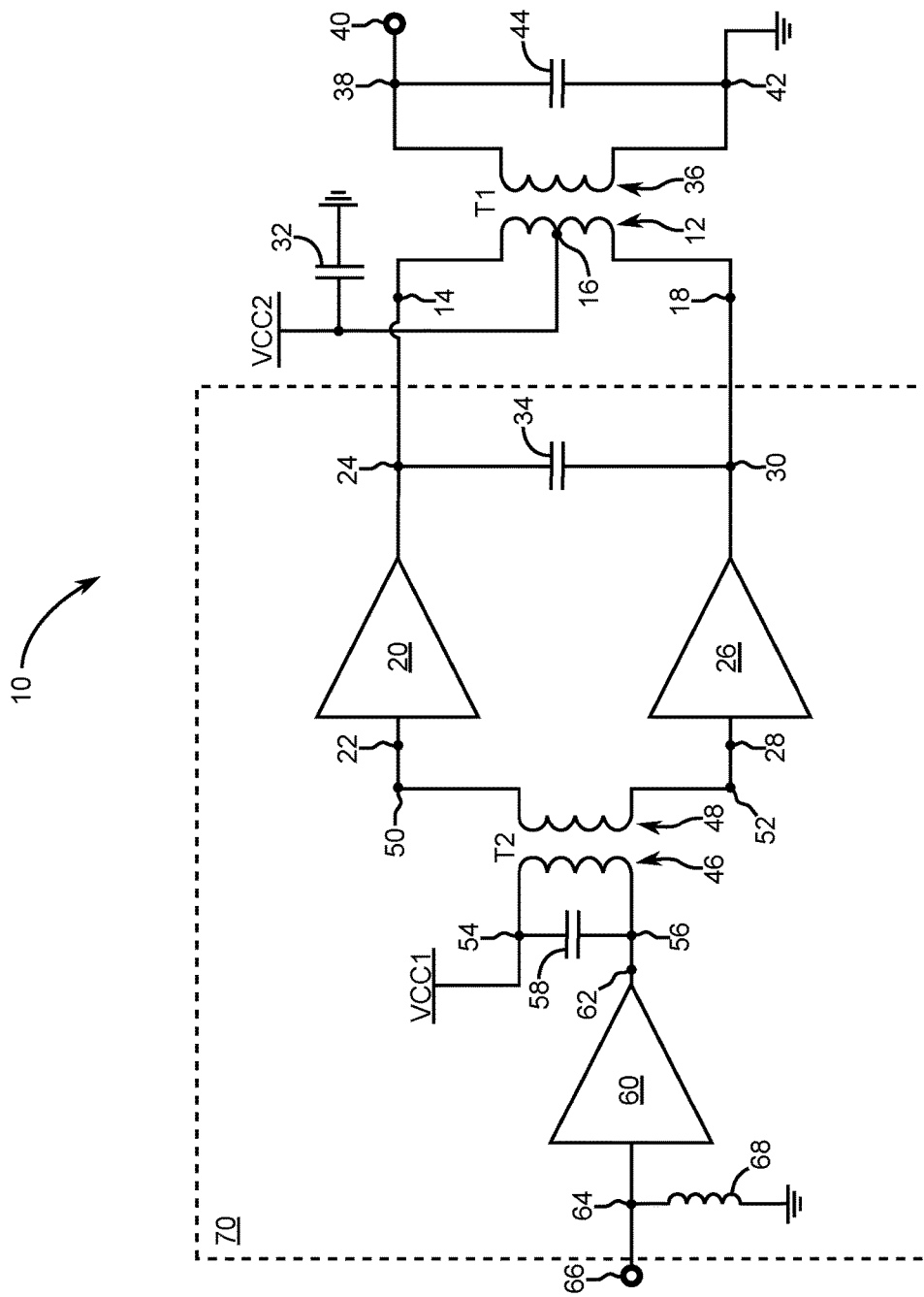
FIG. 1 is a schematic of a related-art differential power amplifier.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein. For example, a transformer is defined herein as having at least a primary winding and a secondary winding wherein the primary winding and secondary winding are magnetically coupled through mutual induction.

FIG. 1 is a schematic of a related-art differential power amplifier 10. The related-art differential power amplifier 10 includes an output transformer T1 having a primary winding 12 with a first primary terminal 14, a center-tap terminal 16, and a second primary terminal 18. The related-art differential power amplifier 10 further includes a first amplifier 20 having a first signal input terminal 22 for receiving a first portion of a radio frequency (RF) signal to be amplified and a first signal output terminal 24 for providing an amplified version of the first portion of the RF signal. The first signal output terminal 24 is coupled to the first primary terminal 14. Further included is a second amplifier 26 having a second signal input terminal 28 for receiving a second portion of the RF signal to be amplified and a second signal output terminal 30 for providing an amplified version of the second portion of the RF signal. The second signal output terminal 30 is coupled to the second primary terminal 18. A direct current (DC) blocking capacitor 32 is coupled between the center-tap terminal 16 and ground, while the center-tap terminal 16 is also coupled to a voltage supply node VCC2. A first fixed tuning capacitor 34 is coupled between the first primary terminal 14 and the second primary terminal 18 to reduce power loss due to leakage associated with the primary winding 12.

The output transformer T1 has a secondary winding 36 that has a first secondary terminal 38 coupled to a single-ended output terminal 40 and a second secondary terminal 42 coupled to ground. A second fixed tuning capacitor 44 is coupled between the first secondary terminal 38 and the second secondary terminal 42 to reduce power loss due to leakage associated with the secondary winding 36.

The related-art differential power amplifier 10 further includes an input transformer T2 having a primary winding 46 and a secondary winding 48. The secondary winding 48 includes a first secondary terminal 50 coupled to the first signal input terminal 22 and a second secondary terminal 52 coupled to the second signal input terminal 28. The primary winding 46 has a first primary terminal 54 coupled to a voltage supply node VCC1 and a second primary terminal 56. A third fixed tuning capacitor 58 is coupled between the first primary terminal 54 and the second primary terminal 56 to reduce power loss due to leakage associated with the primary winding 46.

The related-art differential power amplifier 10 further includes an input amplifier 60 having a signal output terminal 62 coupled to the primary winding 46 of the input transformer T2 by way of the second primary terminal 56. The input amplifier 60 has a single-ended input terminal 64 that is coupled to an RF signal terminal 66. An impedance matching inductor 68 is coupled between the single-ended input terminal 64 and ground. An integrated circuit die 70 integrates the input amplifier 60 with the first amplifier 20 and the second amplifier 26.

Figure 2:
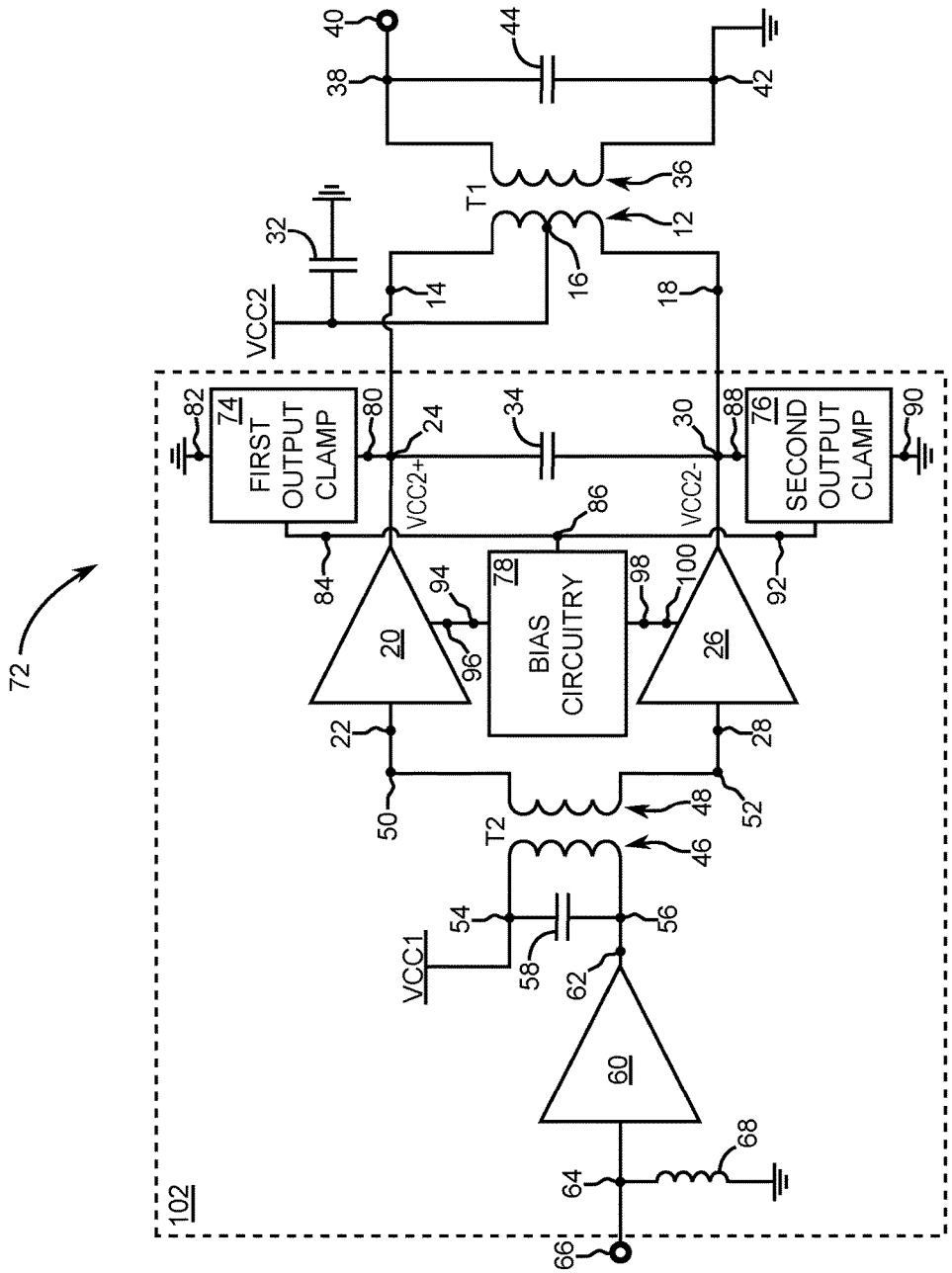
FIG. 2 is a schematic of an exemplary embodiment of a differential power amplifier that is structured in accordance with the present disclosure.

FIG. 2 is a schematic of an exemplary embodiment of a differential power amplifier 72 that is structured in accordance with the present disclosure. The exemplary embodiment may have some or all of the elements of the related-art differential power amplifier 10 of FIG. 1. However, the differential power amplifier 72 further includes protective circuitry made up of a first output clamp 74 configured to limit voltage at the first signal output terminal 24 to a first predetermined voltage magnitude and a second output clamp 76 configured to limit voltage at the second signal output terminal 30. The differential power amplifier 72 further includes bias circuitry 78 that is configured to respond to the first output clamp 74 and/or the second output clamp 76 to lower bias current to the first amplifier 20 and the second amplifier 26.

In the exemplary embodiment of FIG. 2, the first output clamp 74 has a first clamping terminal 80 coupled to the first signal output terminal 24, a first fixed node terminal 82 coupled to a first fixed voltage node such as ground, and a first bias adjust terminal 84 coupled to a bias control terminal 86 of the bias circuitry 78. Moreover, the second output clamp 76 has a second clamping terminal 88 coupled to the second signal output terminal 30, a second fixed node terminal 90 coupled to a second fixed voltage node such as ground, and a second bias adjust terminal 92 coupled to the bias control terminal 86 of the bias circuitry 78. The bias circuitry 78 further includes a first bias current output terminal 94 coupled to a first amplifier bias terminal 96 of the first amplifier 20 and a second bias current output terminal 98 coupled to a second amplifier bias terminal 100 of the second amplifier 26. In the exemplary embodiment of FIG. 2, the first amplifier 20, the second amplifier 26, the input amplifier 60, the bias circuitry 78, the first output clamp 74, and the second output clamp 76 are all integrated together on an amplifier die 102.

Figure 3:
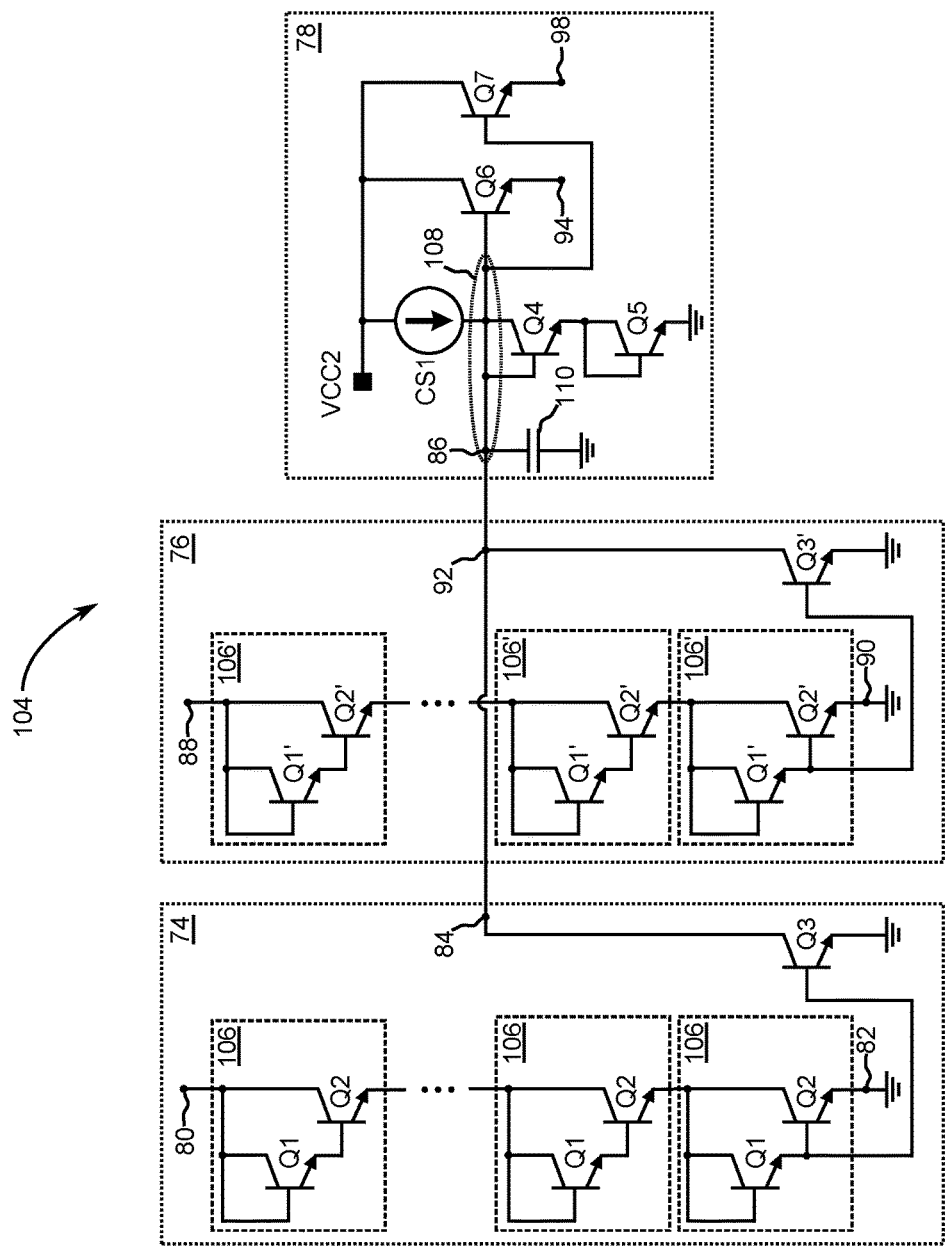
FIG. 3 is a schematic of exemplary protective circuitry that includes exemplary embodiments of a first output clamp, a second output clamp, and bias circuitry.

FIG. 3 is a schematic of exemplary protective circuitry 104 that includes exemplary embodiments of the first output clamp 74, the second output clamp 76, and the bias circuitry 78. The exemplary embodiment of the first output clamp 74 is made up of a stack of clamp cells 106 coupled in series between the first clamping terminal 80 and the first fixed node terminal 82. Each of the clamp cells 106 is made up of a first transistor Q1 and a second transistor Q2 that are connected in a Darlington configuration. Middle ones of the clamp cells 106 are coupled in series from an emitter of a proceeding second transistor Q2 to a collector of a following second transistor Q2. A first predetermined voltage magnitude for a voltage limit at the first signal output terminal 24 (FIG. 2) is determined by the number of clamp cells 106 coupled in series between the first clamping terminal 80 and the first fixed node terminal 82. For example, a base-to-emitter voltage for each of the first transistor Q1 and the second transistor Q2 is from 0.7 V to 0.8 V when providing a clamping action. Thus, for example, a stack of three of the clamp cells 106 provides a predetermined voltage magnitude for the voltage limit at the first signal output terminal 24 from 3(2)(0.7 V) to 3(2)(0.8 V), which is from 4.2 V to 4.8 V.

The first output clamp 74 also includes a first bias adjust transistor Q3 that has a base coupled to an emitter of the first transistor Q1 of one of the clamp cells 106 and an emitter of the second transistor Q2 coupled to the first fixed node terminal 82. A collector of the first bias adjust transistor Q3 is coupled to the first bias adjust terminal 84, and an emitter of the first bias adjust transistor Q3 is coupled to a fixed voltage node such as ground.

The exemplary embodiment of the second output clamp 76 is made up of a stack of clamp cells 106' coupled in series between the second clamping terminal 88 and the second fixed node terminal 90. Each of the clamp cells 106' is made up of a first transistor Q1' and a second transistor Q2' that are connected in a Darlington configuration. Middle ones of the clamp cells 106' are coupled in series from an emitter of a proceeding second transistor Q2' to a collector of a following second transistor Q2'. A second predetermined voltage magnitude for a voltage limit at the second signal output terminal 30 (FIG. 2) is determined by the number of clamp cells 106' coupled in series between the second clamping terminal 88 and the second fixed node terminal 90. For example, a base-to-emitter voltage for each of the first transistor Q1' and the second transistor Q2' is from 0.7 V to 0.8 V when providing a clamping action. Thus, for example, a stack of four of the clamp cells 106' provides a predetermined voltage magnitude for the voltage limit at the second signal output terminal 30 from 4(2)(0.7 V) to 4(2)(0.8 V), which is from 5.6 V to 6.4 V.

The second output clamp 76 further includes a second bias adjust transistor Q3' that has a base coupled to an emitter of the first transistor Q1' of one of the clamp cells 106' and an emitter of the second transistor Q2' coupled to the second fixed node terminal 90. A collector of the second bias adjust transistor Q3' is coupled to the second bias adjust terminal 92, and an emitter of the second bias adjust transistor Q3' is coupled to a fixed voltage node such as ground.

The exemplary embodiment of the bias circuitry 78 includes a first diode-connected transistor Q4 having an emitter coupled to a collector of a second diode-connected transistor Q5 such that both are coupled in series between a base node 108 that includes the bias control terminal 86 and a fixed voltage node such as ground. A filter capacitor 110 is coupled between the base node 108 and a fixed voltage node such as ground. A first bias current transistor Q6 has a collector coupled to the voltage supply node VCC2, a base coupled to the base node 108, and an emitter coupled to the first bias current output terminal 94. A second bias current transistor Q7 has a collector coupled to the voltage supply node VCC2, a base coupled to the base node 108, and an emitter coupled to the second bias current output terminal 98. A current source CS1 coupled between the voltage node VCC2 and the base node 108 cooperates with the first diode-connected transistor Q4 and the second diode-connected transistor Q5 to inject a nominal base current into the bases of the first bias current transistor Q6 and second bias current transistor Q7 to set nominal bias currents emitted from the first bias current transistor Q6 and the second bias current transistor Q7. The transistors Q1-Q7 are all depicted as bipolar junction transistors. However, other devices such as diodes may in certain applications replace the transistors making up the clamp cells 106 and 106'. Further still, it is to be understood that other transistor technologies such as field-effect transistors may also be used in place of bipolar transistors in some applications.

During operation of the exemplary protective circuitry 104, an overvoltage event at the first signal output terminal 24 (FIG. 2) is clamped and limited to a voltage set to a first predetermined voltage magnitude by the number of clamp cells 106 making up the first output clamp 74. Moreover, an increased base current entering the first bias adjust transistor Q3 due to the overvoltage event at the first signal output terminal 24 lessens base current flow into the bases of the first bias current transistor Q6 and the second bias current transistor Q7. The result of less base current flowing into the bases of the first bias current transistor Q6 and the second bias current transistor Q7 is a reduction in the first bias current to the first amplifier 20 and the second bias current to the second amplifier 26, which in turn further limits the possibility of damage to the first amplifier 20 and the second amplifier 26 and to any external elements such as output filters (not shown). The second output clamp 76 operates in similar fashion as the first output clamp 74. Similarly, an increased base current entering the second bias adjust transistor Q3' due to the overvoltage event at the first signal output terminal 24 further lessens base current flow into the bases of the first bias current transistor Q6 and the second bias current transistor Q7 such that even further protection is provided for the first amplifier 20 and the second amplifier 26 and to any external elements in an output path. The filter capacitor 110 may be used to dampen abrupt swings in bias current feedback due to the already relatively fast responsiveness of the exemplary protective circuitry 104.

Figure 4:
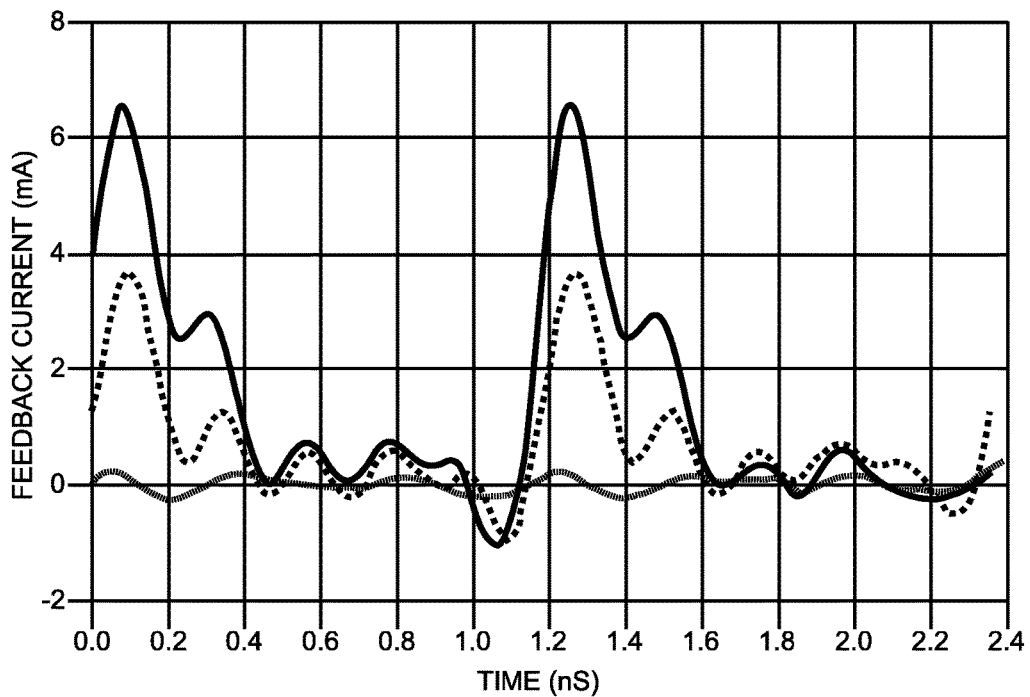
FIG. 4 is a graph of bias current feedback versus time depicting relatively fast responsiveness of the exemplary protective circuitry of FIG. 3.
Figure 5:
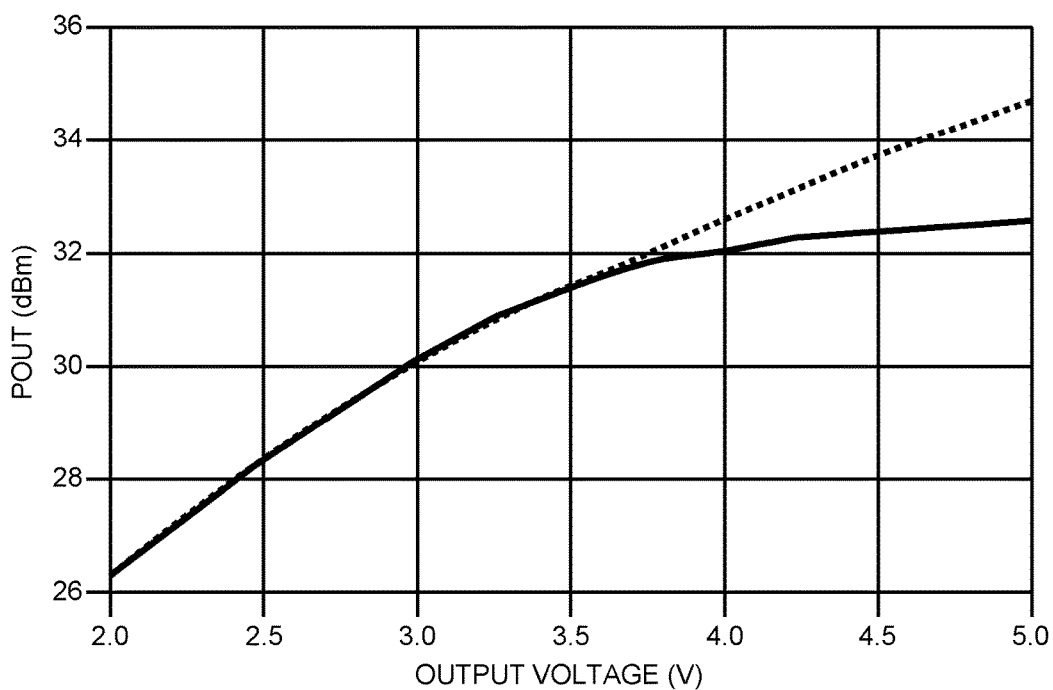
FIG. 5 is a graph depicting power output of the exemplary embodiment of the differential power amplifier of FIG. 2 versus output voltage in comparison to the related-art differential power amplifier of FIG. 1.

In this regard, FIG. 4 is a graph of bias current feedback versus time depicting relatively fast responsiveness of the exemplary protective circuitry 104 (FIG. 3). In particular, the graph of FIG. 4 depicts a sweep of bias current feedback pulses over a period of two RF cycles of a signal being amplified by the first amplifier 20 and the second amplifier 26 (FIG. 2). Moreover, FIG. 5 is a graph depicting power output of the exemplary embodiment of the differential power amplifier 72 of FIG. 2 versus output voltage in comparison to the related-art differential power amplifier 10 of FIG. 1. The solid line in the graph represents operation of the exemplary embodiment of the differential power amplifier 72, whereas the dashed line represents operation of the related-art differential power amplifier 10. Notice that the exemplary protective circuitry 104 limits the output power abruptly once output voltage exceeds an exemplary predetermined voltage magnitude of 3.5 V.

Those skilled in the art will recognize improvements and modifications to the preferred embodiments of the present disclosure. All such improvements and modifications are considered within the scope of the concepts disclosed herein and the claims that follow.

What is claimed is:
1. A differential power amplifier comprising:
   a first amplifier having a first signal output terminal;
   a second amplifier having a second signal output terminal;
   bias circuitry in communication with the first amplifier and the second amplifier, and having a bias control terminal;
   a first output clamp coupled to the first signal output terminal and the bias control terminal, wherein the first output clamp is configured to limit voltage at the first signal output terminal to a first predetermined voltage magnitude and lower bias current to the first amplifier in response to an overvoltage at the first signal output terminal; and
   a second output clamp coupled to the second signal output terminal wherein the second output clamp is configured to limit voltage at the second signal output terminal to a second predetermined voltage magnitude.

2. The differential power amplifier of claim 1 wherein the second output clamp is coupled to the bias control terminal and is further configured to lower bias current to the second amplifier in response to an overvoltage at the second signal output terminal.

3. The differential power amplifier of claim 1 wherein the first output clamp comprises a stack of first clamp cells coupled in series, wherein the first predetermined voltage magnitude is given by how many first clamp cells are in the stack of first clamp cells.

4. The differential power amplifier of claim 3 wherein each first clamp cell comprises a first transistor and a second transistor connected in a Darlington configuration.

5. The differential power amplifier of claim 4 wherein the first output clamp further includes a first current adjust transistor having a base coupled to an emitter of the first transistor of one of the first clamp cells of the stack of first clamp cells and a collector coupled to the bias control terminal of the bias circuitry.

6. The differential power amplifier of claim 3 wherein the second output clamp comprises a stack of second clamp cells coupled in series, wherein the second predetermined voltage magnitude is given by how many second clamp cells are in the stack of second clamp cells.

7. The differential power amplifier of claim 6 wherein each second clamp cell comprises a first transistor and a second transistor connected in a Darlington configuration.

8. The differential power amplifier of claim 7 wherein the second output clamp further includes a second current adjust transistor having a base coupled to an emitter of the first transistor of one of the second clamp cells of the stack of second clamp cells and a collector coupled to the bias control terminal of the bias circuitry.

9. The differential power amplifier of claim 1 wherein the bias circuitry further comprises:
- a first bias current transistor having a collector coupled to a supply voltage node, a base coupled to the bias control terminal, and an emitter coupled to a first amplifier bias terminal of the first amplifier;
- a second bias current transistor having a collector coupled to the supply voltage node, a base coupled to the bias control terminal, and an emitter coupled to a second amplifier bias terminal of the second amplifier; and
- a current source coupled to the base of the first bias current transistor and the base of the second bias current transistor and configured to inject a nominal base current into each of the base of the first bias current transistor and the base of the second bias current transistor.

10. The differential power amplifier of claim 9 wherein the bias circuitry further comprises a first diode-connected transistor having an emitter coupled to a collector of a second diode-connected transistor such that both are coupled in series between a base node that includes the bias control terminal and a fixed voltage node, wherein the first diode-connected transistor and the second diode-connected transistor are configured to cooperate with the current source to inject the nominal base current into each of the base of the first bias current transistor and the base of the second bias current transistor.

11. The differential power amplifier of claim 10 wherein the bias circuitry further comprises a filter capacitor coupled between the base node and the fixed voltage node.

12. The differential power amplifier of claim 11 wherein the fixed voltage node is ground.

13. The differential power amplifier of claim 1 wherein the first amplifier, the second amplifier, the first output clamp, the second output clamp, and the bias circuitry are integrated on an integrated circuit die.

14. The differential power amplifier of claim 1 further including an output transformer having a secondary winding and a primary winding with a first primary terminal and a second primary terminal, wherein the first signal output terminal of the first amplifier is coupled to the first primary terminal and the second signal output terminal of the second amplifier is coupled to the second primary terminal.

15. A differential power amplifier comprising:
- a first amplifier having a first signal output terminal;
- a second amplifier having a second signal output terminal;
- bias circuitry in communication with the first amplifier and the second amplifier, and having a bias control terminal;
- a first output clamp coupled to the first signal output terminal and the bias control terminal, wherein the first output clamp is configured to limit voltage at the first signal output terminal to a first predetermined voltage magnitude and lower bias current to the first amplifier in response to an overvoltage at the first signal output terminal; and
- a second output clamp coupled to the second signal output terminal wherein the second output clamp is configured to limit voltage at the second signal output terminal to a second predetermined voltage magnitude and lower bias current to the second amplifier in response to an overvoltage at the second signal output terminal.

16. The differential power amplifier of claim 15 wherein the first output clamp comprises a stack of first clamp cells coupled in series, wherein the first predetermined voltage magnitude is given by how many first clamp cells are in the stack of first clamp cells.

17. The differential power amplifier of claim 16 wherein each first clamp cell comprises a first transistor and a second transistor connected in a Darlington configuration.

18. The differential power amplifier of claim 17 wherein the first output clamp further includes a first current adjust transistor having a base coupled to an emitter of the first transistor of one of the first clamp cells of the stack of first clamp cells and a collector coupled to the bias control terminal of the bias circuitry.

19. The differential power amplifier of claim 16 wherein the second output clamp comprises a stack of second clamp cells coupled in series, wherein the second predetermined voltage magnitude is given by how many second clamp cells are in the stack of second clamp cells.

20. The differential power amplifier of claim 19 wherein each second clamp cell comprises a first transistor and a second transistor connected in a Darlington configuration.

21. The differential power amplifier of claim 20 wherein the second output clamp further includes a second current adjust transistor having a base coupled to an emitter of the first transistor of one of the second clamp cells of the stack of second clamp cells and a collector coupled to the bias control terminal of the bias circuitry.

* * * * *